United States Patent [19]

Gallagher

[11] 4,057,820
[45] Nov. 8, 1977

[54] DUAL GATE MNOS TRANSISTOR

[75] Inventor: Robert C. Gallagher, Ellicott City, Md.

[73] Assignee: Westinghouse Electric Corporation, Pittsburgh, Pa.

[21] Appl. No.: 701,049

[22] Filed: June 29, 1976

[51] Int. Cl.² .............. H01L 29/78; H01L 27/02; H01L 29/34; H01L 29/04
[52] U.S. Cl. ........................ 357/23; 357/51; 357/54; 357/59
[58] Field of Search ............... 357/23, 51, 54, 59

[56] References Cited

U.S. PATENT DOCUMENTS

| 3,436,623 | 4/1969 | Beer | 357/23 |
| 3,633,078 | 1/1972 | Dill et al. | 357/23 |

Primary Examiner—Edward J. Wojciechowicz
Attorney, Agent, or Firm—H. W. Patterson

[57] ABSTRACT

A dual gate MNOS memory transistor is disclosed. The transistor includes drain and source regions of a first conductivity type formed in a substrate of a second conductivity type. The region of the substrate between the drain and source regions forms the channel of the transistor. First and second insulating layers forming a charged trapping structure overlie the channel region. A first gate having a width less than the width of the channel overlies the central portion of the channel region. A second gate, insulated from the first gate, overlies the first gate and the remainder of the channel region. The threshold voltage of the transistor is shifted by selectively biasing the gates and the substrate. High and low threshold voltage states are used to represent the two values of a digital signal.

8 Claims, 3 Drawing Figures

DUAL GATE MNOS TRANSISTOR

BACKGROUND OF THE INVENTION

1. Field of the Invention

The invention relates to an MNOS transistor and more particularly to dual gate MNOS digital memory transistors.

2. Description of the Prior Art

MNOS transistors utilizing dual layer gate insulator structures to function as digital memories are known in the prior art. These prior art devices can generally be classified in two types. The first and older type utilizes a first layer of silicon oxide and a second layer of silicon nitride overlying the channel region. A conductive gate was then deposited overlying the silicon nitride layer to complete the transistor. If a sufficiently high potential is applied between the gate and substrate, charges would tunnel through the silicon oxide and be trapped in the silicon nitride layer. This cause the threshold of the transistor to be shifted. This shift in threshold could be utilized to represent the high and low values of the stored digital signal.

This prior art device has many undesirable characteristics among them being the reduction of the change in the threshold voltage when these devices were subjected to continuous read-write (i.e., shifting of the threshold voltage between two values) cycling. This degradation is believed to be related to the high fields to which the regions of the oxide layer near the source and drain were subjected to during writing. This difficulty was overcome by increasing the thickness of the oxide layer in the region of the drain and source. However, it was found that increasing the thickness of the oxide in this region also increased the sensitivity of the transistor to radiation.

SUMMARY OF THE INVENTION

The transistor which is the subject of this invention was developed to provide a transistor not subject to degradation due to read-write cycling while retaining the high radiation resistance of the structures utilizing a single thickness oxide layer. These improved characteristics are provided by an MNOS transistor utilizing a single thickness oxide layer and two electrically isolated gates. The first gate is relatively narrow and overlies the central portion of channel region with the second gate overlying the remainder of the channel. The threshold voltage of the transistor is shifted by selectively biasing the transistor to cause charges to tunnel through the oxide underlying the first gate and become trapped near the oxide nitride interface. This reversible shift in the threshold voltage can be accomplished without subjecting the regions of the oxide layer near the drain and source to high electrical fields. Reading is accomplished by applying a read voltage to the first and second gates. Since the transistor uses a single thickness oxide layer it retains the high radiation resistance of the prior art devices.

DESCRIPTION OF THE PREFERRED EMBODIMENT

Figure 1:
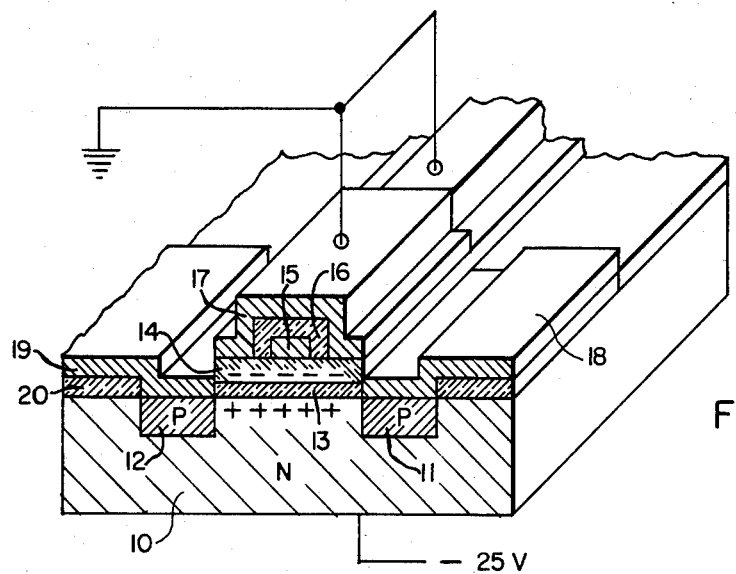
FIG. 1 is a drawing partially in cross-section illustrating the structural features of the dual gate MNOS memory transistor and the biasing voltages used during the initializing cycle.

FIG. 1 is a drawing partially in cross-section illustrating the features of the preferred embodiment of the invention and the biasing arrangement utilized during the initialization cycle. The dual gate MNOS memory transistor includes P conductivity type drain and source regions 11 and 12 formed in an N conductivity type substrate 10. The portion of the substrate 10 between the drain and source regions 11 and 12 forms the channel of the transistor. Overlying the channel region is a thin insulating layer 13, preferably of silicon oxide. This layer is typically in the range of 30 to 100 Angstroms. Overlying the silicon oxide layer 13 is a silicon nitride layer 14. Layer 14 is typically in the range of 300 Angstroms. A first gate 15 preferably formed of high conductivity polycrystalline silicon overlies the central portion of the channel region. An insulating layer 16 of silicon oxide is formed on the top surface of the polysilicon gate 15. Overlying the first gate 15 and insulated therefrom by the insulating layer 16 is a second gate 17 which is preferably metal, such as aluminum. The second gate 17 extends to the outer edge of the silicon nitride layer 14 but preferably does not overlap the drain and source junctions 11 and 12. High conductivity layers 18 and 19 respectively form contact with the source 12 and the drain 11. These layers are insulated from the silicon substrate by insulating layer 20 which can be silicon oxide. The portion of the second gate 17 which overlies the first gate 15 performs no useful function and may be omitted, if desired.

The first step in utilizing the memory transistor is to initialize the device so that the threshold voltage of the transistor with gates 15 and 17 connected together is in the range of −2.5 volts. Initialization is accomplished by connecting the gates 15 and 17 to ground and applying a long duration negative initialize pulse to the substrate 10, as illustrated in FIG. 1. The amplitude of this pulse is sufficiently high to cause a moderate level of charge tunneling through the oxide layer 13. When the initialize pulse is removed negative charges are trapped in the silicon nitride layer 14. These charges attract positive charges to the surface of the channel. The amplitude and duration of the initialize pulse is selected such that the threshold of the transistor with the gates connected together is about −2.5 volts.

The negative charges trapped in the oxide as a result of the initialize pulse are indicated by negative signs in FIG. 1. The corresponding positive charges attracted to the surface of the substrate are indicated by plus signs. A convenient amplitude for the initialize pulse is −25 volts. This amplitude is convenient because a power supply having about −25 volts DC output is frequently used to supply operating bias voltages for MNOS circuits.

When initialization is complete, the transistor is in its high (most positive) threshold state. In utilizing the transistor as a digital memory, this state is sensed by coupling a voltage more negative than the high threshold voltage (−2.5 volts) of the transistor to the gates 15 and 17. This negative read voltage, in the range of −8 volts DC, attracts sufficient positive charges to be to the upper surface of the substrate 10 to create a relatively low resistance path (inversion layer) from the source 12 to the drain 11. This low resistance (on state of the transistor) is interpreted as one value of the digital signal stored in the transistor.

Figure 2:
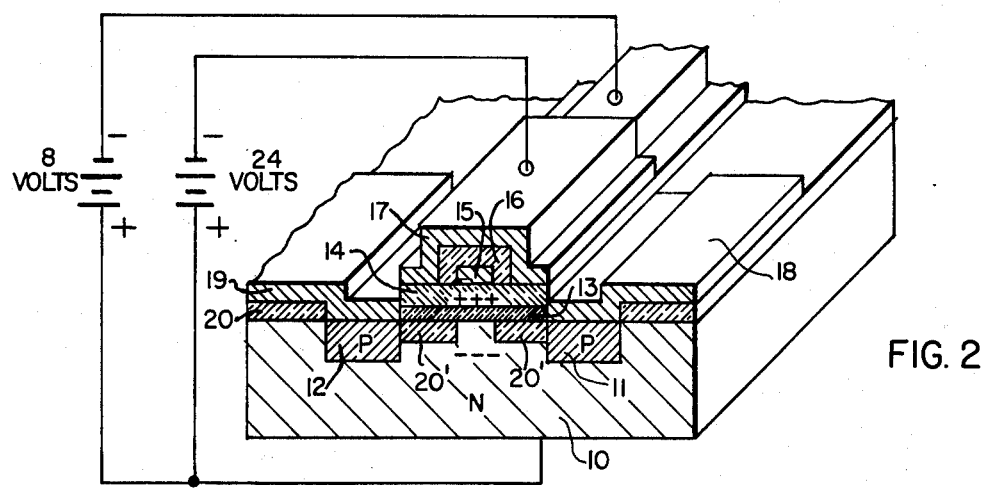
FIG. 2 is a drawing illustrating the biasing voltages used to shift the threshold voltage to its lowest (most negative) value.

The threshold of the transistor is shifted to a more negative (low) value, which is interpreted as the second value of the digital signal, by coupling the second gate 17 to a voltage more negative than the high threshold, (−8 volts, for example) and coupling the first gate 15 to a voltage, in the range of −24 volts DC. The circuit used to accomplish this function is illustrated in FIG. 2. The negative DC voltage coupled to the first gate 15 causes charge tunneling in the central portion of the channel with positive charges accumulating in the central portion of the silicon nitride layer 14. This accumulation of positive charges attracts negative charges to the surface of the substrate 10 shifting the threshold voltage of the central region of the channel to about −10 volts. These accumulations of charges are shown by + and − signs in FIG. 2. The function of the negative voltage coupled to the second gate 17 is to create an inversion layer 20' near the ends of the channel to provide a source of positive charges which tunnel through the oxide layer 13.

The second threshold state of the transistor is sensed in the same manner as the first threshold state. Specifically, first and second gates are coupled to a negative read voltage (in the range of −8 volts DC). This voltage has an amplitude sufficient to create an inversion layer in the portion of the channel underlying the second gate 17 but not under the first gate 15. This causes the central portion of the channel to have a high resistance preventing significant current flow from the source 11 to the drain 12. This high resistance state is interpreted as the second value of the digital signal stored in the transistor.

Figure 3:
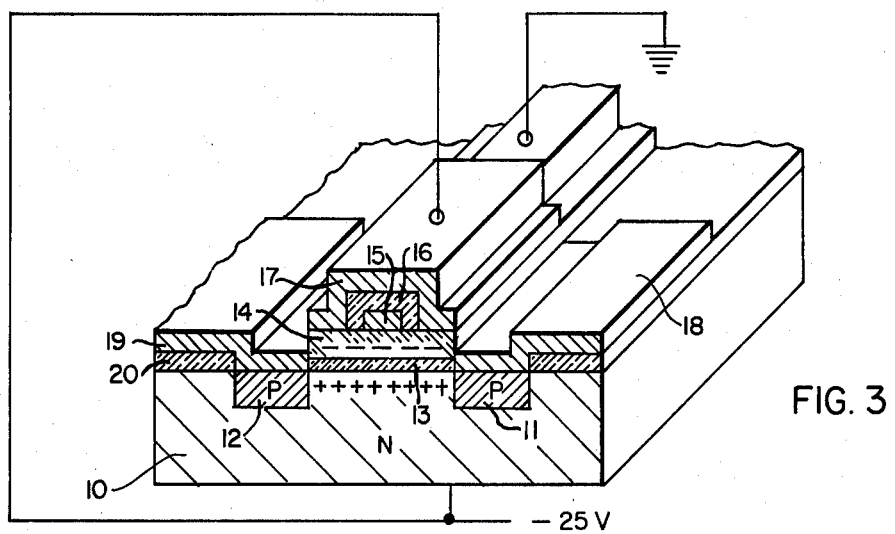
FIG. 3 is a drawing illustrating the biasing voltages used to shift the threshold voltage of the transistor from its lowest (most negative) to its highest (least negative) value.

FIG. 3 illustrates the circuit for shifting the threshold voltage of the transistor from its most negative (low) value to its most positive (high) value. In shifting the threshold voltage from the low to the high value, the first gate 15 is coupled to ground, the second gate 17 and the substrate 10 are coupled to a negative voltage having an amplitude in the range of −25 volts. This causes charge tunneling in the central portion of the channel 10 returning the entire channel to the low threshold state illustrated in FIG. 1. This completes the operating cycle of the transistor when used as a digital memory.

Prior art MNOS memory transistors utilizing an oxide layer of uniform thickness were subject to degradation when subjected to read-write cycling. This degradation is believed to be due to the high voltage stressing of the oxided layer in the regions near the drain and source. The transistor discussed above is not subject to this problem because high voltage stressing of the oxide layer 13 in the regions near the drain and source is limited to the initialization cycle. The disclosed transistor also retains the high radiation resistance of transistors utilizing a single thickness oxide layer.

I claim:
1. An MNOS memory transistor, comprising in combination:
   a. a semiconductor substrate of a first conductivity type having first and second regions of a second conductivity type therein, said first and second regions extending to a common surface of said substrate to form a drain, a source and a channel therebetween;
   b. at least a first insulating structure including a substantially uniform layer disposed on said common surface overlying and substantially coextensive with said channel, said uniform layer being operative at times to trap charges;
   c. a first electrically conductive layer disposed on and overlying only a portion of said insulating structure and said channel inwardly of the inner edges of the source and drain to form a first gate;
   d. a second electrically conductive layer overlying substantially the remaining portions of said insulating structure and the portions of said channel outwardly of the first gate to form a second gate; and
   e. means for applying electrical signals to said first and second regions of opposite conductivity types, said substrate, and said first and second gates, said means being operative to cause said uniform layer to trap charges in response to predetermined electrical signals applied to the first and second gate and substrate.

2. An MNOS transistor in accordance with claim 1 wherein said first insulating structure includes a layer of silicon oxide contiguous with said common surface and a layer of silicon nitride contiguous with said silicon oxide layer.

3. An MNOS transistor in accordance with claim 1 wherein said first electrically conductive layer is high conductivity polysilicon.

4. An MNOS transistor in accordance with claim 1 wherein said second electrically conductive layer is aluminum.

5. An MNOS transistor in accordance with claim 1 wherein said semiconductor substrate is of N conductivity type.

6. An MNOS transistor in accordance with claim 1 wherein said semiconductor substrate is of P conductivity type.

7. An MNOS transistor in accordance with claim 2 wherein said silicon oxide is a substantially uniform layer layer less than 100 Angstroms.

8. An MNOS transistor in accordance with claim 2 wherein said silicon nitride is a uniform layer in the range of 300 Angstroms.

* * * * *

UNITED STATES PATENT AND TRADEMARK OFFICE
CERTIFICATE OF CORRECTION

PATENT NO. : 4,057,820
DATED : November 8, 1977
INVENTOR(S) : Robert C. Gallagher It is certified that error appears in the above-identified patent and that said Letters Patent are hereby corrected as shown below:

Column 4, claim 1, line 27, cancel "opposite" and substitute -- second --; same line, cancel "types" and substitute -- type --.

Column 4, claim 7, line 52, cancel "layer", second occurrence.

*Signed and Sealed this*

*Twenty-sixth* Day of *February 1980*

[SEAL]

*Attest:*

SIDNEY A. DIAMOND

*Attesting Officer*   *Commissioner of Patents and Trademarks*